United States Patent
Bruno

(10) Patent No.: US 7,312,686 B2
(45) Date of Patent: Dec. 25, 2007

(54) SPLIT CORE SENSING TRANSFORMER

(75) Inventor: David Bruno, Portland, OR (US)

(73) Assignee: Veris Industries, LLC, Portland, OR (US)

( * ) Notice: Subject to any disclaimer, the term of this patent is extended or adjusted under 35 U.S.C. 154(b) by 0 days.

(21) Appl. No.: 10/968,560

(22) Filed: Oct. 18, 2004

(65) Prior Publication Data

US 2006/0006976 A1 Jan. 12, 2006

Related U.S. Application Data

(60) Provisional application No. 60/586,303, filed on Jul. 7, 2004.

(51) Int. Cl.
*H01F 27/28* (2006.01)

(52) U.S. Cl. .......................... 336/229; 336/90

(58) Field of Classification Search ........ 336/174–176, 336/225, 229, 90, 92; 324/127, 547
See application file for complete search history.

(56) References Cited

U.S. PATENT DOCUMENTS

| | | | | | |
|---|---|---|---|---|---|
| 1,569,723 | A | * | 1/1926 | Dickinson | 336/66 |
| 1,830,541 | A | * | 11/1931 | Harris | 336/176 |
| 4,048,605 | A | * | 9/1977 | McCollum | 336/176 |
| 4,386,280 | A | * | 5/1983 | Ricaud et al. | 307/145 |
| 4,851,803 | A | * | 7/1989 | Hahn | 336/176 |
| 4,970,476 | A | * | 11/1990 | Kitagawa | 333/12 |
| 5,426,360 | A | * | 6/1995 | Maraio et al. | 324/126 |
| 6,756,776 | B2 | * | 6/2004 | Perkinson et al. | 324/127 |

* cited by examiner

*Primary Examiner*—Tuyen T. Nguyen
(74) *Attorney, Agent, or Firm*—Chernoff, Vilhauer, McClung & Stenzel

(57) ABSTRACT

Separable toroidal segments reduce the size of a sensing transformer that can be installed on an electrical conductor while connected to a device.

7 Claims, 7 Drawing Sheets

SPLIT CORE SENSING TRANSFORMER

This application claims the benefit of U.S. patent application Ser. No. 60/586,303 filed Jul. 7, 2004.

STATEMENT REGARDING FEDERALLY SPONSORED RESEARCH OR DEVELOPMENT

Not applicable.

CROSS-REFERENCE TO RELATED APPLICATIONS

Not applicable.

BACKGROUND OF THE INVENTION

The present invention relates to devices for sensing electrical current and, more particularly, to a split core sensing transformer for a current sensor.

It is often desirable to monitor power consumption in the individual branch circuits of a facility as well as the overall energy usage by the facility. Individual branch circuit monitoring not only permits billing for energy consumption by the various consumers, but permits billing to be extended to take into account low power factors or high total harmonic distortion, promoting efficiency by allowing the operator of the facility to determine whether and where capital investment for power quality enhancement equipment would provide the best return on investment. Individual branch circuit monitoring can also indicate conditions in the branch circuit, and trigger alerts in case limits on such parameters as RMS voltage or current, power factors, or harmonic distortion are exceeded.

Currents in each of the branch circuits in a facility are typically measured by connecting a current sensor to sense the current flowing in each of the branch power cables exiting the facility's power distribution panel. Generally, a current sensor comprises a sensing transformer installed on an electrical conductor of interest and an electronic circuit that produces an output representative of the electrical current carried by the conductor. The current sensor may be an individual meter for a single circuit or a networked meter that can be temporarily connected, respectively, to each of a plurality of circuits to periodically and momentarily monitor the current in each circuit.

The typical sensing transformer used to sense the electrical current flowing in a power cable comprises a coil of wire wrapped around the cross-section of a magnetically permeable core that encircles the power cable. A sensing transformer with a hinged, split toroidal core is often used because the transformer can be easily affixed to an installed power cable without disconnecting the power cable from a connected device, such as, a circuit breaker in a distribution panel. Cota, U.S. Pat. No. 5,502,374 discloses a split core sensing transformer comprising a toroidal housing divided into a pair of housing halves. Each half of the housing retains a half of the toroidal core of the transformer. The housing halves are interconnected by a hinge located near one end of each half of the housing. The hinge permits pivoting of the housing halves to separate the ends of the housing halves opposite the hinge. The power conductor is passed between the separated ends of the housing halves and the housing halves are then pivoted together encircling the centrally positioned power conductor with the two halves of the toroidal core. On the ends of the housing halves opposite the hinge, a ridge on one housing half and a matching recess on the other half of the housing form a latch to hold the hinged housing halves closed around the power conductor. While the hinged split core sensing transformer permits encirclement of a connected power cable, the hinge is bulky and installation on the closely spaced, branch power conductors in a distribution panel can be difficult.

What is desired, therefore, is a split core sensing transformer that is compact and easily installed on the closely spaced power cables in a distribution panel without disconnecting the cable.

DETAILED DESCRIPTION OF THE INVENTION

Figure 1:
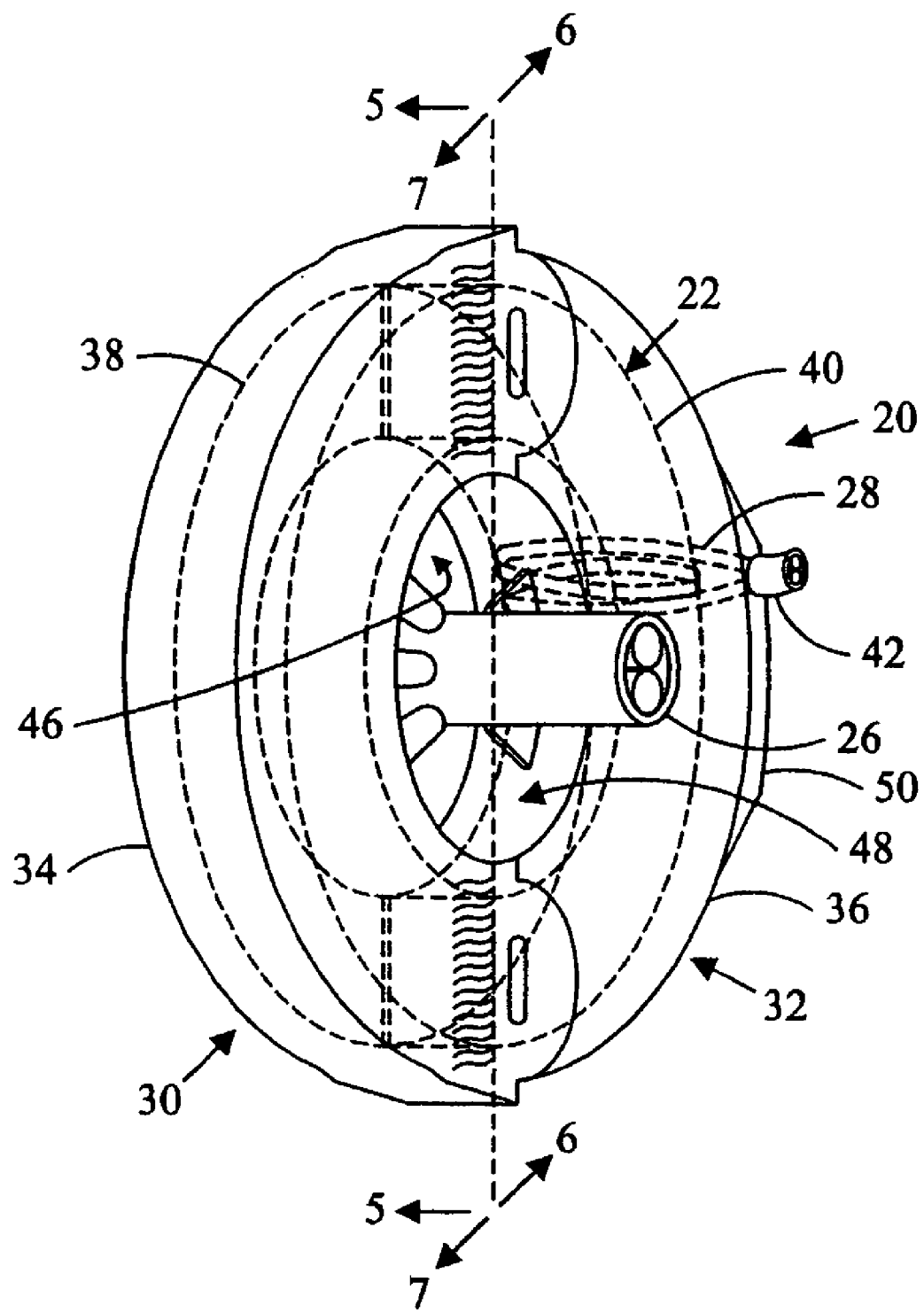
FIG. 1 is a perspective schematic of a split core sensing transformer.

Referring in detail to FIGS. 1-7 where similar parts of the invention are identified by like reference numerals, a sensing transformer 20 comprises a magnetically permeable toroidal core 22 that substantially encircles a power conductor 26 that is connected to conduct an electrical current to be measured. The core 22 is a ferrous torus typically having a rectangular or circular cross-section. One or more turns of wire 28 are wrapped around the cross-section of a sector 24 (indicated by a bracket) of the toroidal core 22.

A changing current (i.e. alternating current) in a power conductor produces a changing magnetic field around the conductor which, in turn, induces a magnetic flux in the magnetically permeable core of a sensing transformer encircling the power conductor. The magnetic flux in the toroidal core induces a current in the wire windings that is representative of the current flowing in the power conductor. Thus, the power conductor is the primary winding and the wire winding is the secondary winding of the sensing transformer. The ends of the wire winding are electrically connected to a burden resistor that converts the current signal received from the secondary winding of the sensing transformer to a voltage signal representing the current flowing in the conductor.

Figure 2:
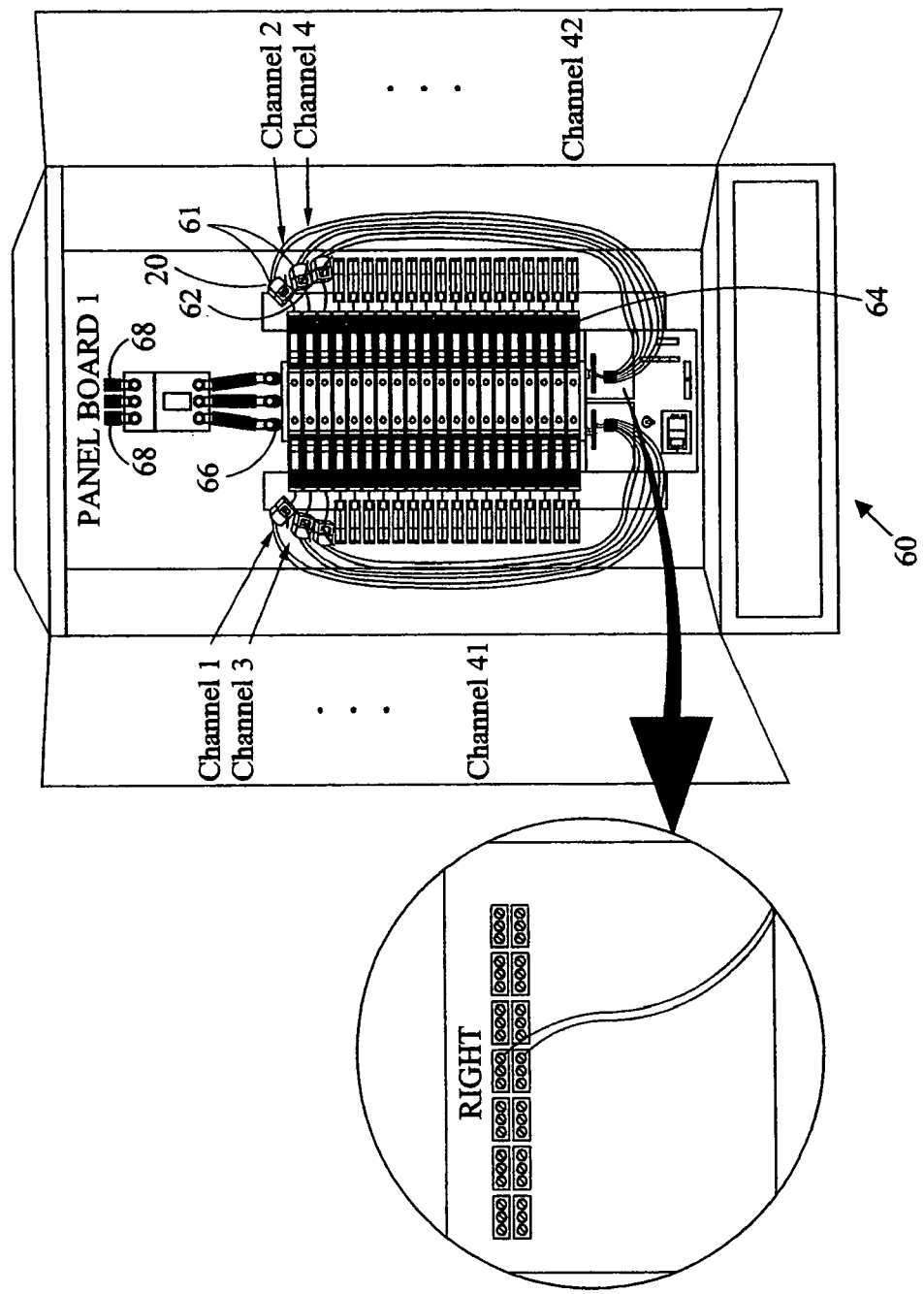
FIG. 2 is a front view of an electrical distribution panel including a plurality of sensing transformers arranged to encircle branch electrical conductors.
Figure 3:
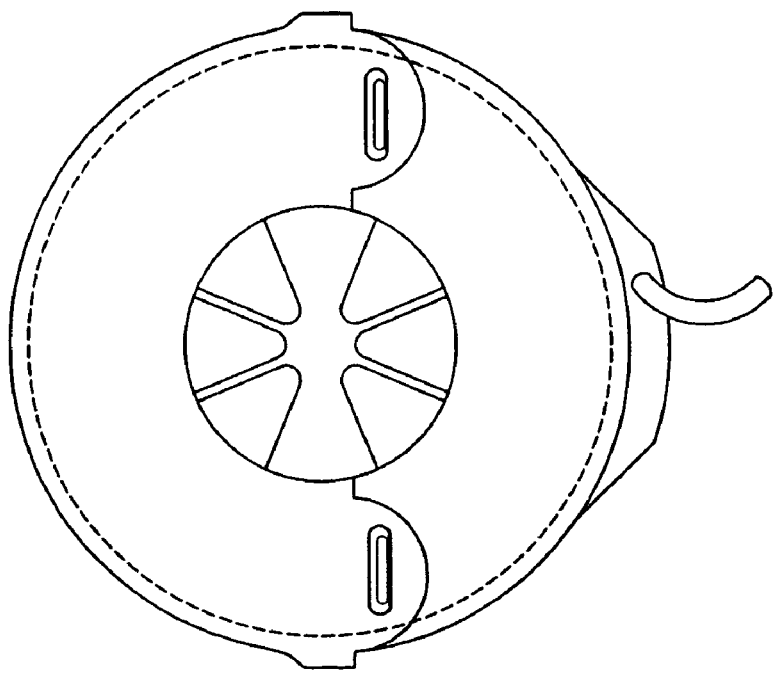
FIG. 3 is a side elevation of a split core sensing transformer.
Figure 4:
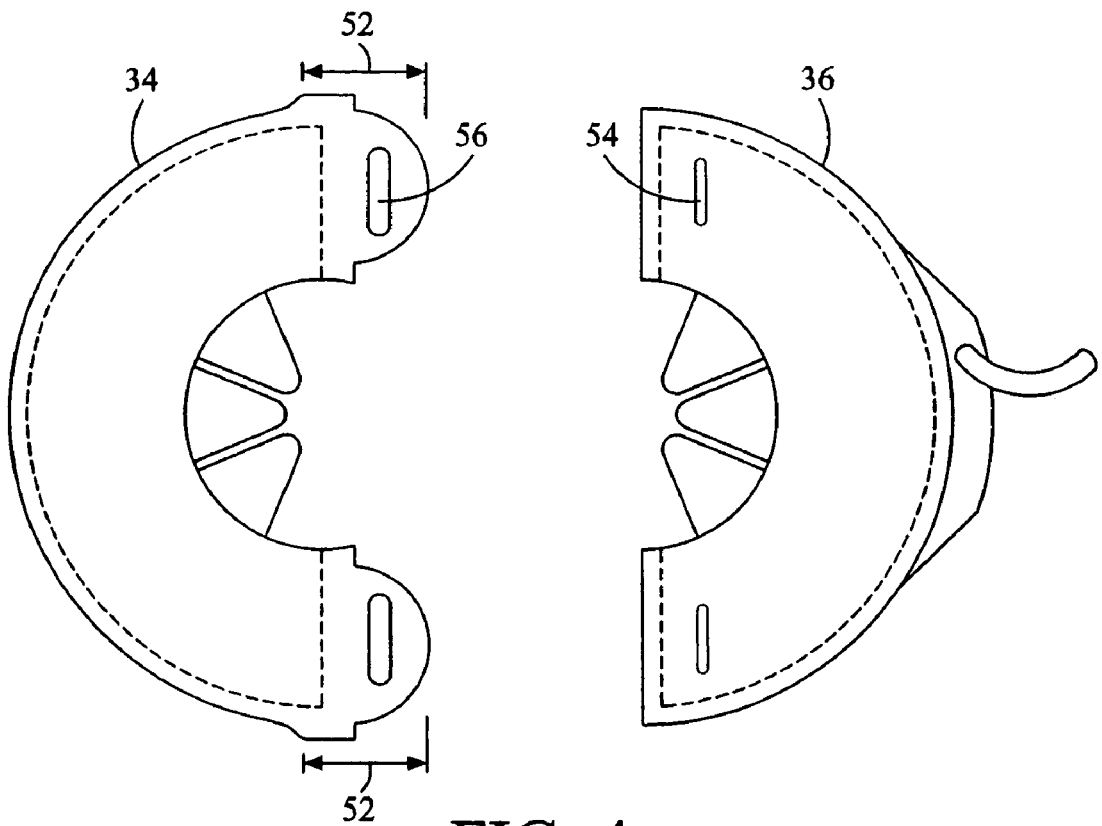
FIG. 4 is a side elevation of the separated segments of the split core sensing transformer of FIG. 3.
Figure 5:
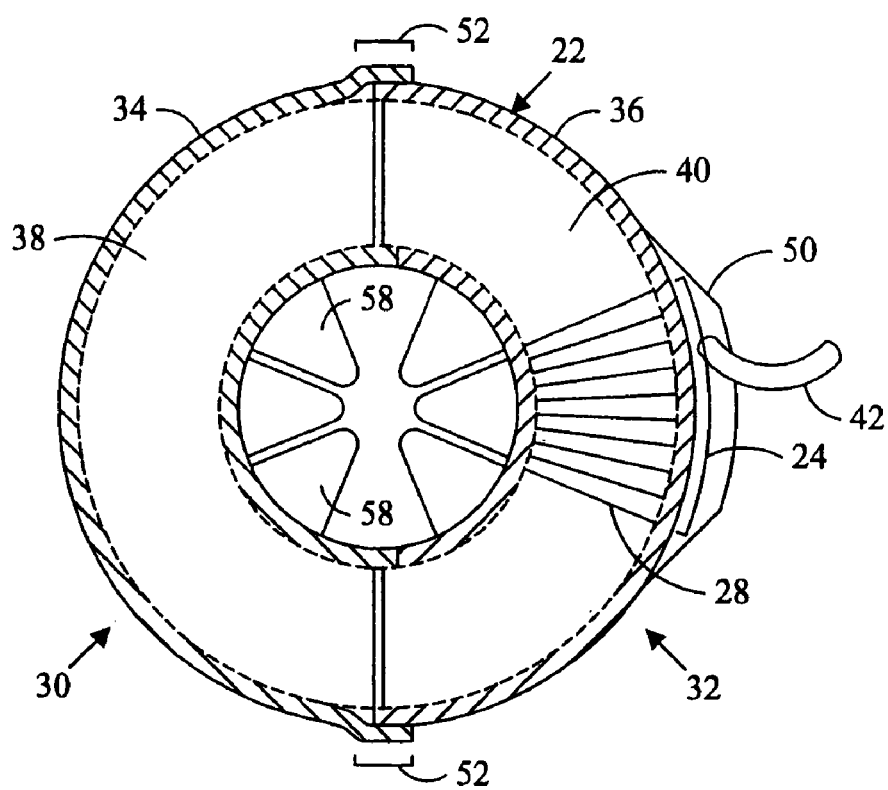
FIG. 5 is a section view of the split core sensing transformer of FIG. 1 taken along line 5-5.
Figures 6, 7:
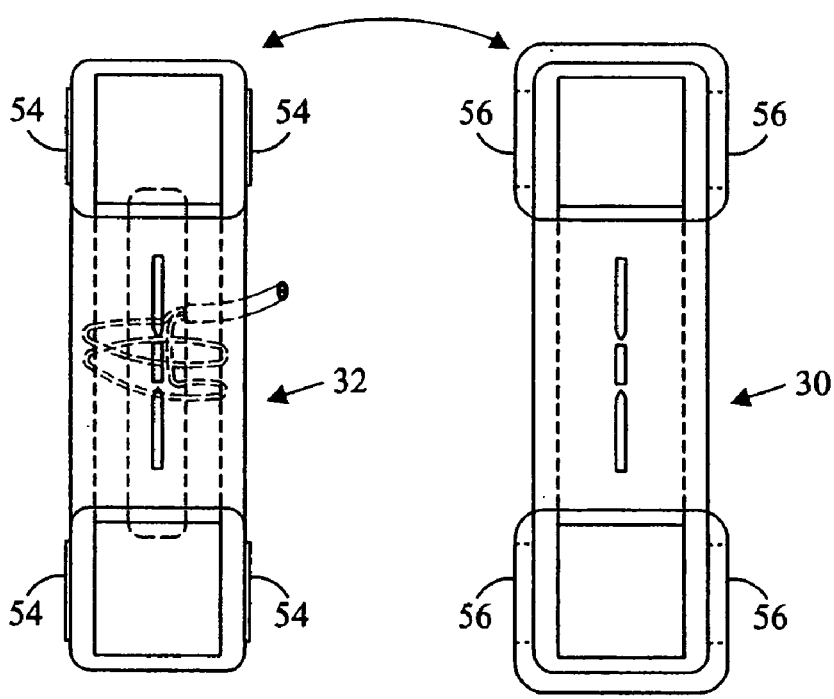
FIG. 6 is a section view of the split core sensing transformer of FIG. 1 taken along line 6-6.
FIG. 7 is a section view of the split core sensing transformer of FIG. 1 taken along line 7-7.

To measure the current in several branch circuits in a facility, sensing transformers are installed on each of the respective branch power conductors. Referring to FIG. 2, the sensing transformers 61 are typically installed on the branch power conductors 62 at the distribution panel 60 where the branch power conductors are connected to circuit breakers 64 that protect the branch circuitry from high current. The plurality of circuit breakers 64 are usually arranged immediately adjacent to each other in the distribution panel and are typically connected to bus bars 66 that are, in turn, connected to the input conductors 68 bringing power from the power grid to the distribution panel.

The branch power conductors 62 are typically attached to the respective circuit breakers 64 by a screw actuated clamp. Disconnecting a plurality of branch power conductors 62 to install encircling sensing transformers is time consuming and requires that power be disconnected from at least the branch circuit in which the transformer is to be installed. A hinged, split core sensing transformer permits the ends of housing halves, each retaining a half of the toroidal core of the transformer, to be spread apart so that the power conductor can be passed between the spread ends. With the power conductor centrally positioned between the housing halves, the housing halves are pivoted together encircling the power conductor with the toroidal core of the transformer. This avoids the necessity of disconnecting the power conductor to install the sensing transformer, but the closeness of adjacent circuit breakers in the distribution panel leaves little room for the sensing transformers between the relatively stiff branch conductors. The hinge connecting the halves of the housing of the hinged split core transformer substantially increases the cross-section of the housing in the region of the hinge making installation of the transformer on the closely spaced branch power conductors difficult. In addition, the halves of a split core transformer are often urged to the closed position by a spring that further increases the bulk of the transformer housing and further complicates installation in the close quarters of a distribution panel. The inventor concluded that a split core sensing transformer having separable segments that can be positioned on opposing sides of a conductor and then pressed together could substantially reduce the physical size of the sensing transformer facilitating installation in the crowded environment of a distribution panel while retaining the convenience of a hinged spilt core transformer.

Referring to FIGS. 1-7, the split core sensing transformer 20 comprises at least two separable transformer segments 30, 32. Each segment comprises a respective segment housing 34, 36 and a sector of a magnetically permeable toroidal core 38, 34 that, when installed, will substantially encircle an electrical power conductor 26. One or more turns of wire 28 is wrapped around the cross-section of a sector of the toroidal core 22. An alternating current in a conductor 26 passing through the central aperture 48 of the transformer 20 produces a changing magnetic field around the conductor that induces a magnetic flux in the magnetically permeable core 22. The magnetic flux, in turn, induces a current in the wire windings 28 on the core 22. The ends of the wire winding 28 are electrically connected through a cable 42 to a burden resistor (not shown) that converts the current signal received from the wire winding 28 of the sensing transformer 20 to a voltage signal representing the current flowing in the conductor.

The magnetically permeable core 22 comprises a ferrous material and is constructed of sectors 38, 40 that when arranged end-to-end form, substantially, a torus. The core 22 has a planar cross-section bounded by a closed curve that is typically rectangular or circular. The torus is the result of rotating the planar cross-section about an axis that lies in the plane of the cross-section but does intersect the plane of the cross-section. Each sector 38, 40 of the core 22 includes a curved inner surface 46 which will, when the sectors are arranged end-to-end, define the central aperture 48 of the sensing transformer 20. An exemplary sensing transformer includes a toroidal core of 3% silicon steel, grain oriented, with an outside diameter of 1.375 inches, an inside diameter of 1.125 inches, and a depth of 0.50 inches in a direction parallel to the axis about which the cross-section of the torus is rotated.

The sectors of the toroidal core 38, 40 are retained within respective separable housing segments 34, 36 that substantially sheath the cross-section of the toroidal core sectors. The housing segment 36 that encloses the core sector 40 that is wrapped with the wire winding 28 includes an extended portion 50 that encloses the connections of the wire winding to the conductors in the cable 42 that conducts signals from the wire winding to the instrumentation and provides an anchor for the cable.

A substantially tubular projecting portion 52 (indicated by a bracket) of walls of one of the housing segments 30 projects beyond the ends of the sector of the core 38 retained in the housing segment. The projecting portions 52 are enlarged to provide an interior sufficiently large to slidably accept in mating engagement the ends of the housing 36 of the other transformer segment 32. One of the housing segments 36 also includes a raised ridge 54 projecting from either side of the housing adjacent to the ends of the segment. Each of the raised ridges 54 is arranged to engage a corresponding aperture 56 in the wall of the mating housing segment 36 to prevent the engaged segments from separating. The surfaces of the housing segments 30, 32 that define the central aperture of sensing transformer 20 also include a plurality of resiliently flexible triangular fingers 58 projecting radially inward to provide a central opening for the power conductor 26. If the power conductor is larger than the opening provided by the ends of the triangular fingers 58, the fingers will bend resiliently outward to accommodate the power conductor. Typically, the housing is made of an electrically insulating thermoplastic material such as nylon or polyvinyl chloride (PVC).

To install the split core transformer 20 on a power conductor 26, the conductor is positioned between the separated segments 30, 32 of the transformer housing adjacent the surfaces that will form the central aperture 48 of transformer. The cooperating ends of the housing segments 34, 36 are aligned and the segments 30, 32 are pressed into mating engagement. When the housings 34, 36 of the segments 30, 32 are fully engaged, the two sectors 38, 40 of the core substantially encircle the power conductor 26 and the cooperating ridges 54 on the side of the housing of one segment mate with the corresponding apertures 56 in the housing of the other segment. Interference of the ridges 54 with a surface of the apertures 56 resists separation of the segments. The sensing transformer can be removed from the power conductor by inserting a screwdriver or other tool between the segment housings to release the mated ridges and apertures, permitting the segments to be separated. Signals from the sensing transformer are transmitted to the appropriate instrumentation through the cable 42.

Figure 8:
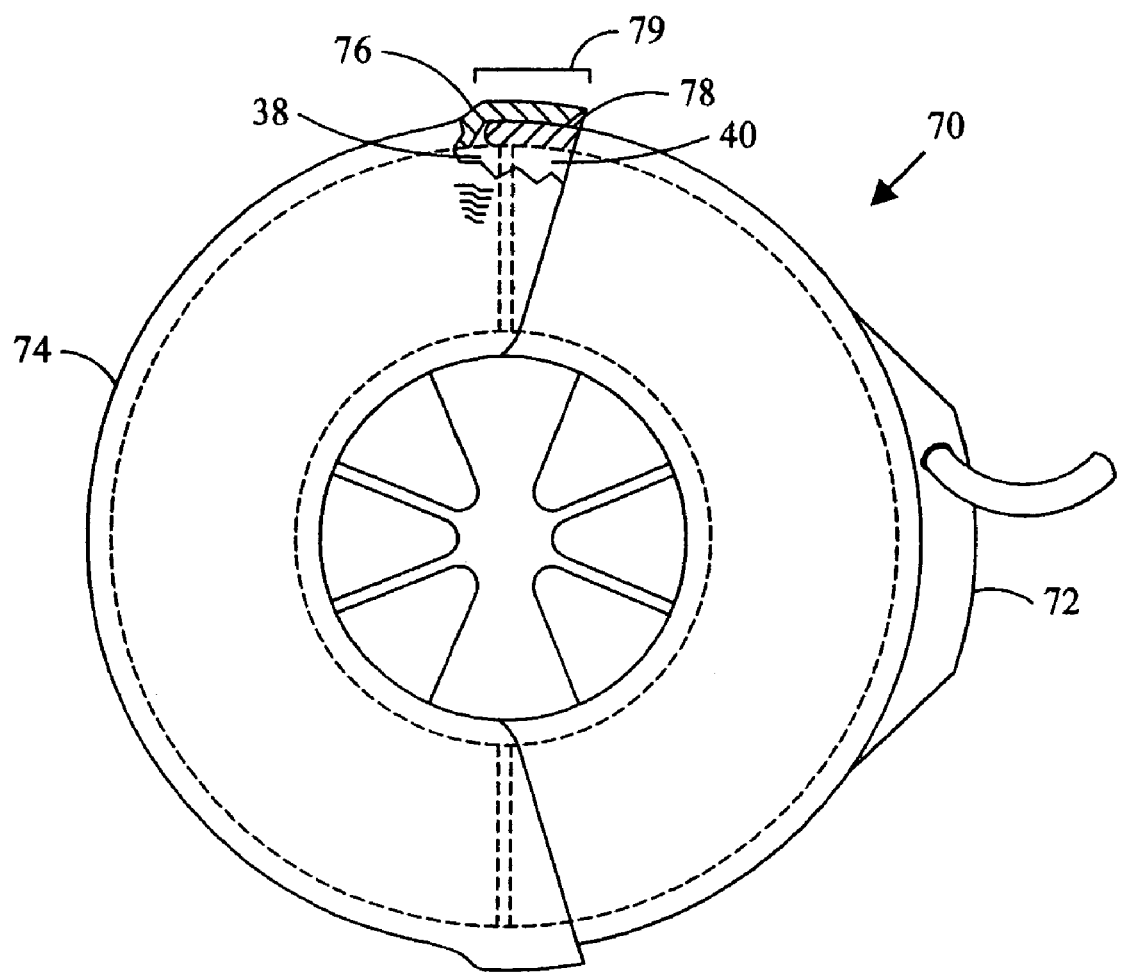
FIG. 8 is a side elevation of second embodiment of the split core sensing transformer partially broken away to illustrate securement of the transformer segments.

Referring to FIG. 8, a second embodiment of the split core sensing transformer 70 comprises two transformer segments 72, 74 that include toroidal core sectors 38, 40 that are retained in the substantially sheathing segment housings 76 and 78, respectively. The segment housing 76 includes a substantially tubular enlarged portion 79 (indicated by a bracket) that has an interior sufficiently large to slidably accept the ends of the second segment housing 78. Both of segment housings 76, 78 comprise annular sectors of more than 180° and the longest chord of the segment housing 78 exceeds the minimum chordal distance between the inner walls of the enlarged portions 79 on opposing sides of the segment housing 76. The housing segment 76 is typically manufactured from a thermoplastic material, such as nylon, and can elastically deform to permit the ends of the housing segment 78 to be pressed into the enlarged portion 79. Once the housing segment 78 is pressed into engagement with the enlarged portion 79 of the housing segment 76, the elastic forces in the housing return the enlarged portion to its original size restraining the housing segments against disengagement. The housing segment 78 may also be manufactured from a thermoplastic material but may be manufactured from thermosetting material for reduced deformation and increased resistance to separation.

Figure 9:
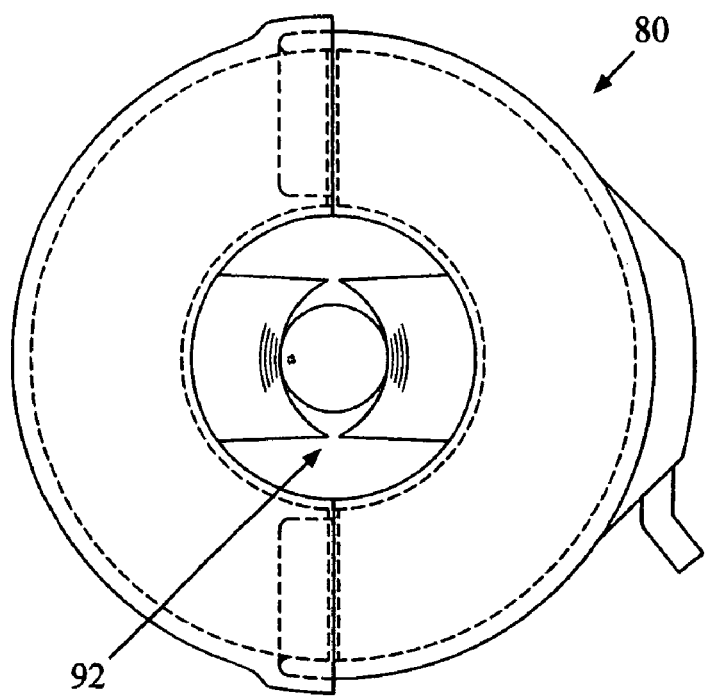
FIG. 9 is a side elevation of a third embodiment of the split core sensing transformer.
Figure 10:
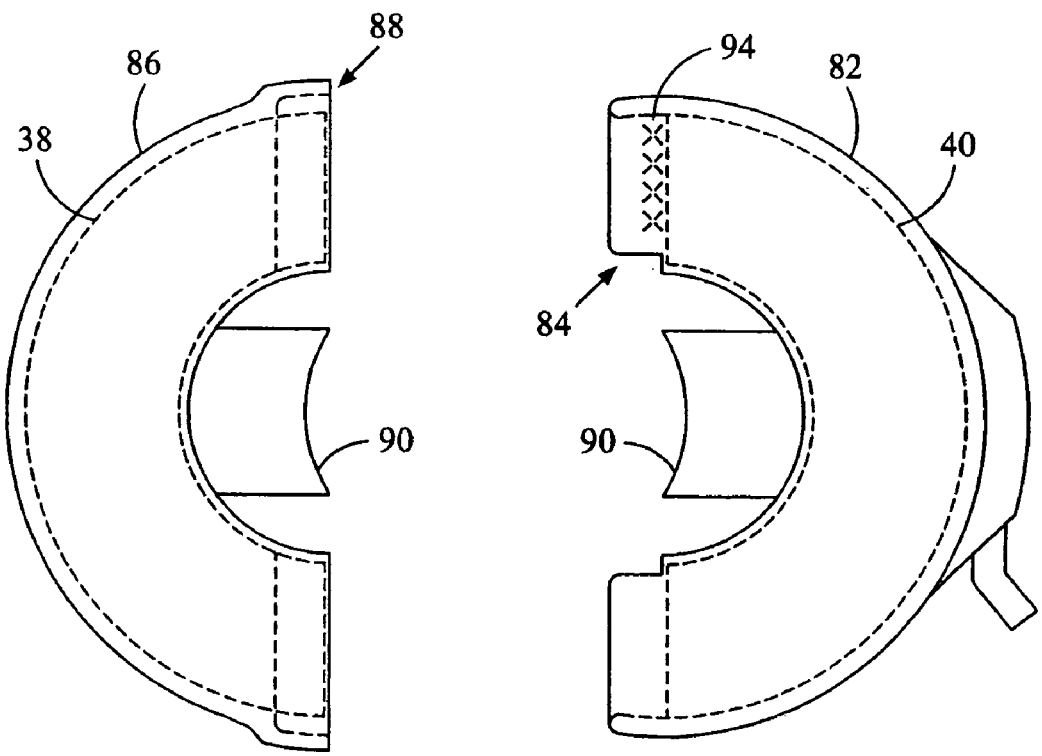
FIG. 10 is a side elevation of the separated segments of the split core sensing transformer of FIG. 9.

Referring to FIGS. 9 and 10, in another embodiment of the split core sensing transformer 80 the housing of one segment 82 includes a wall portion 84 that extends beyond the end of the transformer core segment 40. The housing of the second segment 86 includes an interior wall portion 88 that is separated from the transformer core sector 38 that is retained in the housing. With the segments 82, 86 positioned on opposing sides of a power conductor, the cooperating ends of the housing segments are pressed into engagement. The projecting portion 84 of the housing of the first segment 82 is forced between the interior of the wall of the housing of the second segment 86 and the transformer core sector 38. Friction resulting from the interface of the projecting portion 84 of the housing of the first segment 82 and the transformer core sector 38, and the resilient walls of the housing of the second segment 86 prevents separation of the transformer sectors 82, 86. Friction between the mating portions 84, 88 of the transformer housing segments 82, 86 can be enhanced to restrain the engaged segments by the application of a coating of a friction enhancing substance 92, such as tacky adhesive, to the mating surfaces of one of the housing segments. Resilient blocks 90 projecting toward the center of the central aperture 92 of the sensing transformer 80 are elastically deformable to accommodate power conductors of differing diameters.

Figure 11:
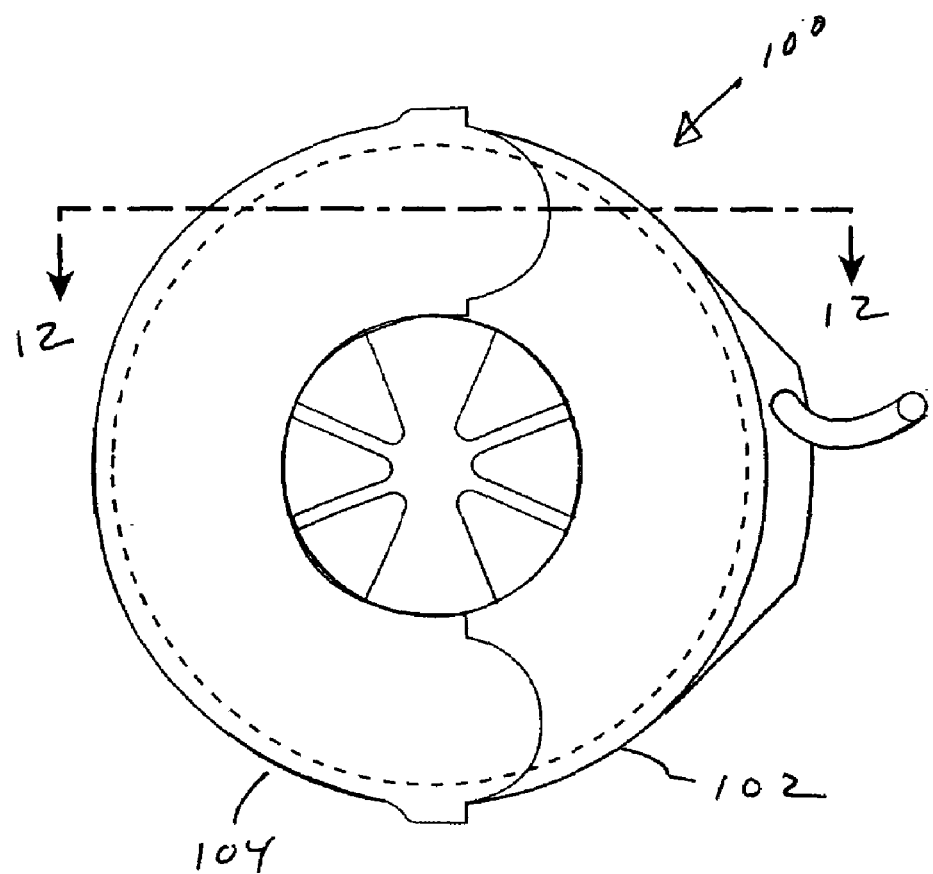
FIG. 11 is a side elevation of a fourth embodiment of split core sensing transformer.
Figure 12:
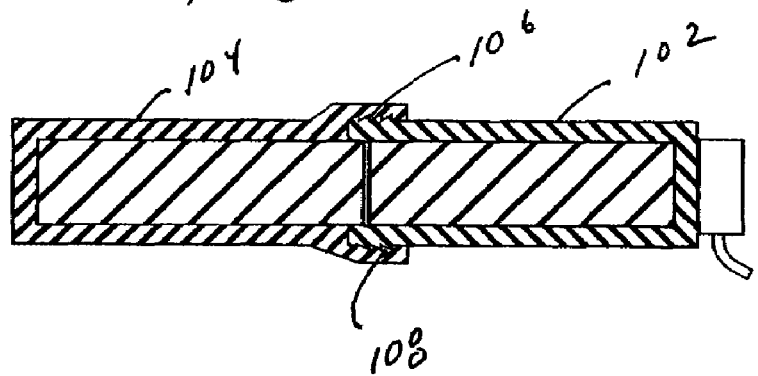
FIG. 12 is a sectional view of the split core sensing transformer of FIG. 11 taken along 12-12.

FIGS. 11 and 12 illustrate still another embodiment of the split core sensing transformer 100. Similar in construction to the split core transformer 20, the split core transformer 100 includes housing halves 102, 104 arranged for mating engagement at the ends thereof. A plurality complementary ridges 106 and 108 are formed on the approximal interior and exterior surfaces of the respective housing halves 102 and 104. When the housing halves are brought into engagement and pressed together the complimentary ridges 106, 108 mutually interfere to prevent separation of the halves of the transformer.

The small size of the split core sensing transformer comprising separable segments facilitates installation on connected power cables in the crowded environment of a power distribution panel.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A sensing transformer comprising:
   (a) a first transformer segment including:
       (i) a first magnetically permeable core comprising a sector of a torus having a planar cross-section bounded by a closed curve, said planar cross-section rotated about an axis in said plane of said cross-section but not intersecting said plane of said cross-section;
       (ii) a winding including at least one turn substantially encircling said cross-section of said core; and
       (iii) a first segment housing retentively sheathing said winding and a portion of said first core; and
   (b) a second transformer segment separable from said first transformer segment, said second transformer segment including:
       (i) a second magnetically permeable core comprising another sector of said torus; and
       (ii) a second segment housing retentively sheathing a portion of said second core, said second segment housing separable from said first segment housing to enable separation of said first and said second transformer segments and joinable to said first segment housing to restrain said first and said second cores in a substantially toroidal arrangement.

2. The sensing transformer of claim 1 wherein:
   (a) said first segment housing comprises a first surface including a second surface arranged substantially normal to said first surface; and
   (b) said second segment housing includes a latch portion arranged to automatically engage said second surface and resist separation of said first segment housing and said second segment housing when a portion of said first segment housing is received within said second segment housing.

3. The sensing transformer of claim 1 wherein one of said first segment housing and said second segment housing comprises a portion arranged to slidably receive the other of said first segment housing and said second segment housing between said receiving segment housing and said core sheathed by said receiving segment housing, friction between said segment housings and between said interposed segment housing and said core resisting separation of said transformer segments.

4. A sensing transformer comprising:
   (a) a first transformer segment including:
       (i) a first magnetically permeable core comprising a sector of a torus having a planar cross-section bounded by a closed curve, said planar cross-section rotated about an axis in said plane of said cross-section but not intersecting said plane of said cross-section; and
       (ii) a first segment housing retentively sheathing said first core, said first segment housing comprising an outer surface including a first surface portion and a second surface portion arranged normal to said first surface portion; and (b) a second transformer segment separable from said first transformer segment, said second transformer segment including:
  (i) a second magnetically permeable core comprising another sector of said torus; and
  (ii) a second segment housing retentively sheathing a portion of said second core, said second segment housing including an inner surface portion arranged to slidably receive said outer surface of said first segment housing in mating engagement to restrain said first core and said second core in a substantially toroidal arrangement, said inner surface portion including a latch surface arranged to automatically engage said second surface portion of said first segment housing when said outer surface of said first segment housing is slidingly received by said second segment housing, engagement of said latch surface and said second surface portion resisting separation of said first and said second transformer segments.

5. The sensing transformer of claim 4 wherein one of said first segment housing and said second segment housing includes portions defining an aperture and one of said first surface and said latch surface comprises a bounding surface of said aperture.

6. A sensing transformer comprising:
(a) a first transformer segment including:
  (i) a first magnetically permeable core comprising a sector of a torus having a planar cross-section bounded by a closed curve, said planar cross-section rotated about an axis in said plane of said cross-section but not intersecting said plane of said cross-section; and
  (ii) a first segment housing retentively sheathing said first core, said first segment housing including a convex surface; and
(b) a second transformer segment separable from said first transformer segment, said second transformer segment including:
  (i) a second magnetically permeable core comprising another sector of said torus; and
  (ii) a second segment housing retentively sheathing a portion of said second core and including an engagement portion arranged to receive in mating engagement a portion of said first segment housing and restrain said first and said second cores in a substantially toroidal arrangement, said engagement portion included a concave surface arranged to interact with said convex surface of said first segment housing when said first and said second segment housings are engaged, interaction of said concave and said convex surfaces resisting separation of said first and said second transformer segments.

7. The sensing transformer of claim 6 wherein elastic deformation of at least one of said first and said second segment housings urges interaction of said convex and said concave surfaces.

\* \* \* \* \*

UNITED STATES PATENT AND TRADEMARK OFFICE
CERTIFICATE OF CORRECTION

PATENT NO.         : 7,312,686 B2
APPLICATION NO.    : 10/968560
DATED              : December 25, 2007
INVENTOR(S)        : Bruno It is certified that error appears in the above-identified patent and that said Letters Patent is hereby corrected as shown below:

Col. 2, line 40
Change "along 12-12." to --along line 12-12.--.

Col. 4, lines 47-48
Change "of transformer." to --of the transformer--.

Col. 5, line 49
Change "A plurality complementary" to --A plurality of complementary--.

Claim 6, Col. 8, lines 17-18
Change "portion included a" to --portion including a--.

Signed and Sealed this

Fourth Day of November, 2008

JON W. DUDAS
*Director of the United States Patent and Trademark Office*